United States Patent [19]
Oritani

[11] Patent Number: 4,504,748
[45] Date of Patent: Mar. 12, 1985

[54] SENSE AMPLIFIER CIRCUIT

[75] Inventor: Atsushi Oritani, Yokohama, Japan

[73] Assignee: Fujitsu Limited, Kawasaki, Japan

[21] Appl. No.: 310,976

[22] Filed: Oct. 13, 1981

[30] Foreign Application Priority Data

Oct. 15, 1980 [JP] Japan ................. 55-144162

[51] Int. Cl.³ ............ H03K 5/24; H03K 3/023; H03K 3/356; G11C 7/06
[52] U.S. Cl. .................. 307/530; 307/279; 307/297; 307/491; 365/205; 365/208
[58] Field of Search ........... 307/355, 362, 358, 530, 307/279, 297, 491, 494, 497; 330/253, 261; 365/190, 196, 202, 205, 208, 212, 226

[56] References Cited

U.S. PATENT DOCUMENTS

| | | | |
|---|---|---|---|
| 4,053,873 | 10/1977 | Freeman et al. | 307/530 X |
| 4,136,292 | 1/1979 | Suzuki et al. | 307/355 |
| 4,213,098 | 7/1980 | Tsividis | 330/253 |
| 4,232,270 | 11/1980 | Marmet et al. | 330/253 |
| 4,375,039 | 2/1983 | Yamauchi | 307/530 |
| 4,400,800 | 8/1983 | Kurafuji | 365/205 X |

Primary Examiner—Larry N. Anagnos
Attorney, Agent, or Firm—Staas & Halsey

[57] ABSTRACT

A sense amplifier circuit used in, for example, a MIS static RAM includes a differential amplifier ($Q_{11}$ through $Q_{14}$) for sensing and amplifying the difference in potential between two input lines (DB and $\overline{DB}$) and generating two bipolar differential signals (D and $\overline{D}$) and a pull-down circuit ($Q_{15}$) for establishing a reference potential ($V_{REF}$) for the differential amplifier. A compensation circuit ($Q_{16}$, $Q_{17}$ and $Q_{18}$) is provided for detecting the in-phase component of the input lines so as to control the pull-down circuit. Therefore, the fluctuation of the reference potential follows the fluctuation of the in-phase component of the input lines so that a stable and high-speed sensing operation is effected.

13 Claims, 8 Drawing Figures

SENSE AMPLIFIER CIRCUIT

BACKGROUND OF THE INVENTION

1. Field of the Invention

The present invention relates to a sense amplifier circuit which is, for example, used in a MIS static random access memory (RAM).

2. Description of the Prior Art

In general, a MIS static RAM cell comprises a bistable flip-flop circuit which uses four or six transistors per bit. That is, the memory cell has a pair of driver transistors which are cross-coupled to each other, a pair of load resistors or load transistors, and a pair of transfer transistors connected to one word line and to one pair of bit lines. In this memory cell, only one of the driver transistors is turned on to correspond to memory data "1" or "0". In order to read the cell, the transfer transistors are turned on by changing the potential of the word line and the data on the driver transistors is transferred to the bit lines. In this memory, a sense amplifier circuit is provided for sensing and amplifying a small difference in potential between the bit line pair.

One conventional sense amplifier circuit used in a MIS static RAM has a differential amplifier for sensing and amplifying a small difference in potential between a bit line pair, and a pull-down circuit for generating a reference potential to the differential amplifier. In this case, the pull-down circuit is controlled by a power supply or a voltage which is in response to the power supply. However, in this conventional sense amplifier circuit, when the potential of the power supply is increased, the potentials of the bit line pair are also increased, while the reference potential for the differential amplifier is unchanged or decreased. As a result, the difference between the potentials of the bit line pair and the reference potential is increased, which deteriorates the sensing operation of the sense amplifier circuit. In other words, the sensing operation is susceptible to fluctuation in the power supply. In particular, in a high-integrated memory wherein the cell area thereof is small, the conductance gm of the driver transistors is small, so that the difference in potential between the bit line pair is very small. As a result, the sensing operation is very susceptible to fluctuation in the power supply.

SUMMARY OF THE INVENTION

Therefore, it is a principal object of the present invention to provide a sense amplifier circuit which can perfom a stable operation even when the potential of the power supply fluctuates.

According to the present invention, there is provided a sense amplifier circuit comprising: first and second power supplies; first and second input lines; first and second output lines; a differential amplifier, connected to the first power supply, to the first and second input lines and to the first and second output lines, for sensing and amplifying the difference in potential between the first and second input lines and generating bipolar signals, whose difference in potential is in response to the difference in potential between the first and second input lines, to the output lines; a first pull-down circuit, connected to the differential amplifier and to the second power supply, for pulling down the reference potential of the differential amplifier; and a compensation circuit, connected to the first and second power supplies, to the pull-down circuit and to the input lines, for detecting the in-phase component of the potentials of the input lines so as to control the conductance of the pull-down circuit.

The present invention will be more clearly understood from the following description, contrasting the present invention with the conventional circuit, and with reference to the accompanying drawings.

DESCRIPTION OF THE PREFERRED EMBODIMENT

Figure 1:
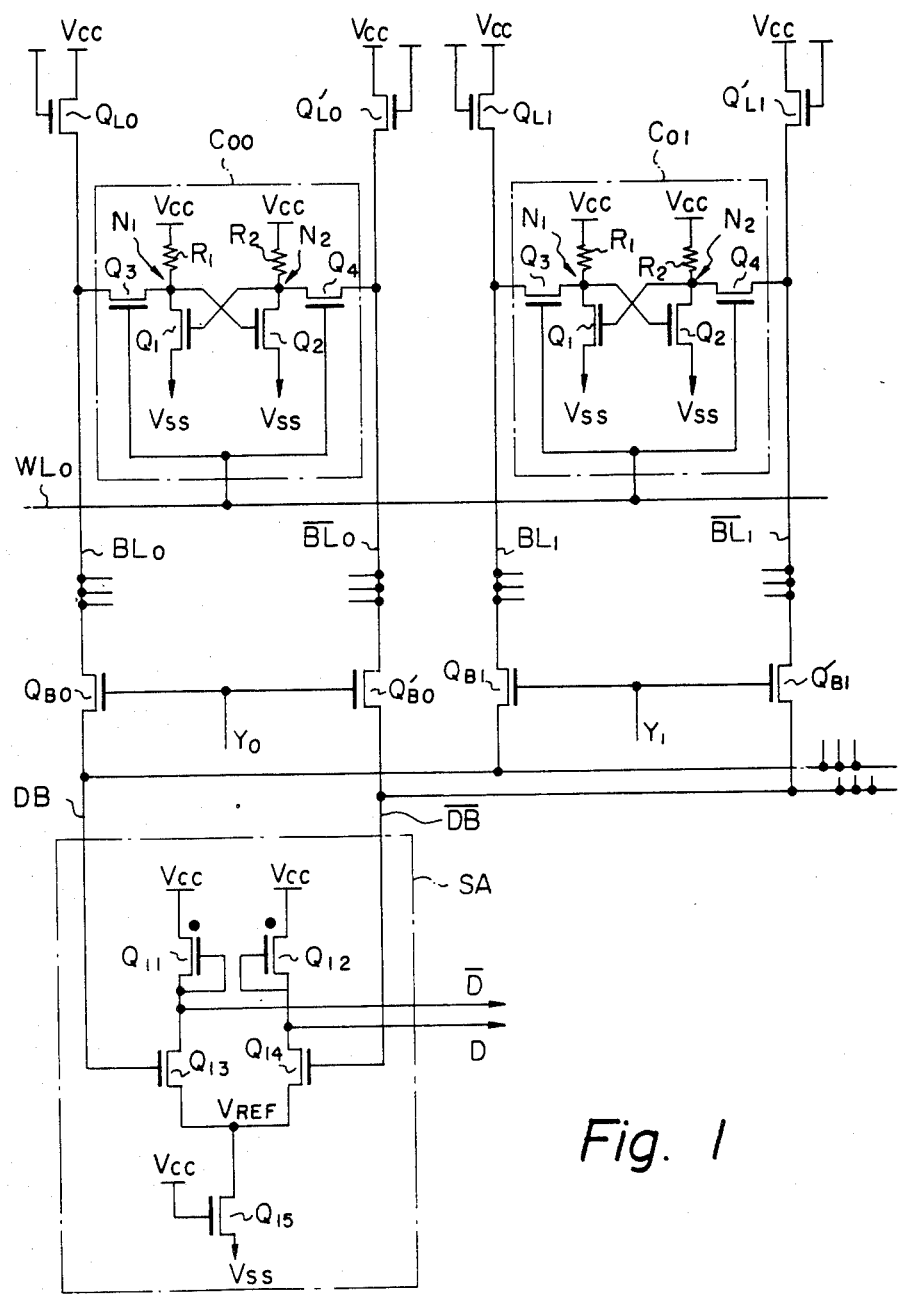
FIG. 1 is a circuit diagram illustrating one conventional sense amplifier circuit applied to a MIS static RAM.

In FIG. 1, which illustrates one conventional sense amplifier circuit applied to a MIS static RAM, $C_{00}$ and $C_{01}$ are memory cells; $WL_0$ is a word line; $BL_0$, $\overline{BL_0}$, $BL_1$ and $\overline{BL_1}$ are bit lines; $Q_{L0}$, $Q_{L0}'$, $Q_{L1}$ and $Q_{L1}'$ are load transistors connected to a power supply; $Q_{B0}$, $Q_{B0}'$, $Q_{B1}$ and $Q_{B1}'$ are column selection transistors which are selected by column selection signals $Y_0$ and $Y_1$; DB and $\overline{DB}$ are data bit lines; and SA is a sense amplifier circuit connected to the data bit lines DB and $\overline{DB}$.

Each of the memory cells $C_{00}$ and $C_{01}$ comprises resistors $R_1$ and $R_2$, driver transistors $Q_1$ and $Q_2$ with drains and gates cross-coupled, and transfer transistors $Q_3$ and $Q_4$.

In the sense amplifier circuit SA, a differential amplifier, which is formed by depletion type load transistors $Q_{11}$ and $Q_{12}$ and enhancement type input transistors $Q_{13}$ and $Q_{14}$, senses and amplifies the difference in potential between the data bit lines DB and $\overline{DB}$ and generates bipolar differential signals D and $\overline{D}$. A pull-down circuit formed by an enhancement transistor $Q_{15}$ determines a reference potential $V_{REF}$ of the differential amplifier. Note that the power supply voltage $V_{CC}$ is applied to the gate of the transistor $Q_{15}$.

The operation of the circuit of FIG. 1 will now be explained. For example, when the data stored in the cell $C_{00}$ is read out, the potential of the word line $WL_0$ is caused to be high by a word decoder/driver (not shown) so as to turn on the transfer transistors $Q_3$ and $Q_4$, and simultaneously, or after that, the potential of the column selection signal $Y_0$ is caused to be high so as to turn on the transistors $Q_{B0}$ and $Q_{B0}'$. At this time, if the state of the cell $C_{00}$ is that the transistors $Q_1$ and $Q_2$ are turned on and off, respectively, that is, the potentials at nodes $N_1$ and $N_2$ are low and high, respectively, the potentials of the bit lines $BL_0$ and $\overline{BL_0}$ become low and high, respectively. In addition, the potentials of the data bit lines DB and $\overline{DB}$ also become low and high, respectively. Therefore, the difference in potential between the data bit lines DB and $\overline{DB}$ is sensed and amplified by the sense amplifier SA so that the differential signals D and $\overline{D}$ are obtained.

Figure 2:
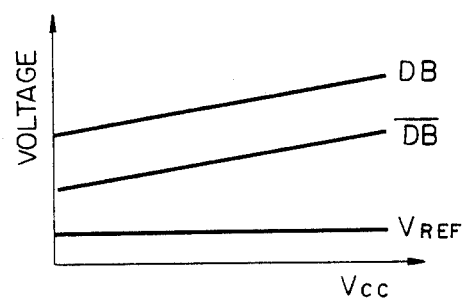
FIGS. 2 and 3 are diagrams for explaining the operation of the prior art circuit of FIG. 1.
Figure 3:
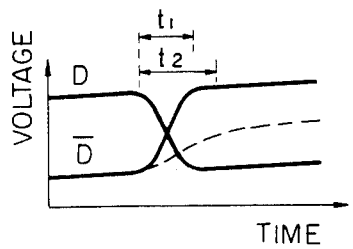

In this state, when the power supply $V_{CC}$ fluctuates, for example, when the potential of the power supply $V_{CC}$ is increased, the potentials of the data bit lines DB and $\overline{DB}$ are also increased, as illustrated in FIG. 2. However, since the gate potential of the transistor $Q_{15}$ is also increased so as to increase the conductivity of the transistor $Q_{15}$, the reference potential $V_{REF}$ is unchanged or becomes a little low. As a result, the difference between the potential of the data bit line DB and the reference potential $V_{REF}$ and the difference beween the potential of the data bit line $\overline{DB}$ and the reference potential $V_{REF}$ both become large. At worst, even when the potential of the data bit line $\overline{DB}$ is low, the transistor $Q_{14}$ is not turned off. As a result, as indicated by the broken line in FIG. 3, the high-potential side differential output signal $\overline{D}$ rises slowly, and in addition, the potential level of the signal $\overline{D}$ is reduced. That is, the access time is changed from an optimum time $t_1$ to a long time $t_2$. Further, at worst, the signals D and $\overline{D}$ are both determined to be low by a subsequent circuit. This is because the in-phase component (or common direct component) of the data bit line DB and $\overline{DB}$ become large as compared with the differential component thereof. Therefore, the fluctuation tolerance of the power supply $V_{CC}$ is small, and in addition, the access time becomes large and at worst, a read-out error may be generated.

Contrary to this, in the present invention, even when the potential of the power supply $V_{CC}$ fluctuates, the reference potential $V_{REF}$ is changed in response to the potential fluctuation of the data bit lines DB and $\overline{DB}$ so as to obtain an accurate and high-speed sensing operation.

Figure 4:
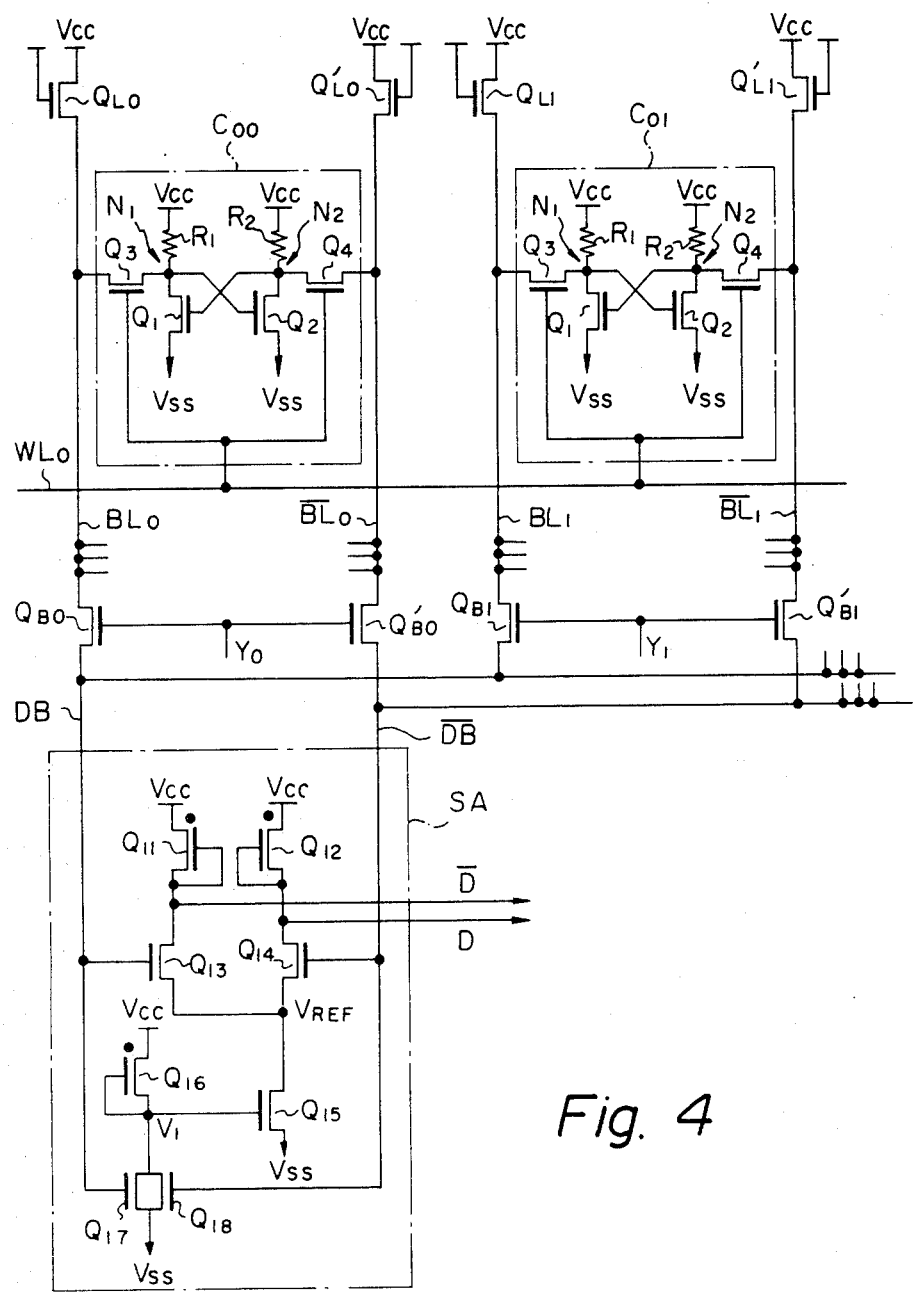
FIG. 4 is a circuit diagram a first embodiment of the sense amplifier circuit according to the present invention, applied to a MIS static RAM.

FIG. 4 is a circuit diagram illustrating a first embodiment of the sense amplifier circuit according to the present invention, applied to a MIS static RAM. In FIG. 4, the elements which are the same as those of FIG. 1 are denoted by the same references. In FIG. 4, a compensation circuit formed by a depletion type load transistor $Q_{16}$ and enhancement type transistors $Q_{17}$ and $Q_{18}$ is added to the sense amplifier circuit SA of FIG. 1. In this case, the gates of the transistors $Q_{17}$ and $Q_{18}$ are connected to the data bit lines DB and $\overline{DB}$, respectively, and the transistor $Q_{16}$ is connected to the power supply $V_{CC}$ and to the transistors $Q_{17}$ and $Q_{18}$. Further, the pull-down circuit formed by the transistor $Q_{15}$ is controlled by the potential $V_1$ at a node connecting the transistor $Q_{16}$ to the transistors $Q_{17}$ and $Q_{18}$.

In the circuit of FIG. 4, when the driver transistors $Q_1$ and $Q_2$ of the selected memory cell $C_{00}$ are turned on and off, respectively, the potentials of the data bit lines DB and $\overline{DB}$ are low and high, respectively. In this case, the differential component of the data bit lines DB and $\overline{DB}$ is suppressed by the compensation circuit formed by the transistors $Q_{16}$, $Q_{17}$ and $Q_{18}$, so that the potential $V_1$ is not changed. That is, if one of the potentials of the data bit lines DB and $\overline{DB}$ is high, then the other is low. Therefore, if one of the transistors $Q_{17}$ and $Q_{18}$ is turned on, then the other is turned off. As a result, the compensation circuit is unchangeable. Therefore, in this case, the pull-down circuit formed by the transistor $Q_{15}$ is controlled by the potential $V_1$ which is constant.

Figure 5:
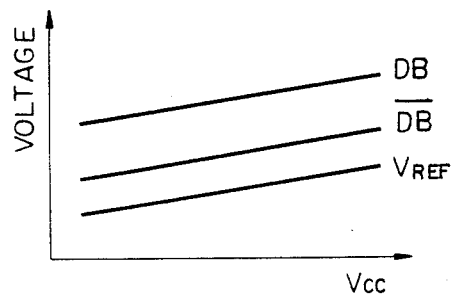
FIG. 5 is a diagram for explaining the operation of the circuit of FIG. 4.

On the other hand, in the circuit of FIG. 4, when the power supply $V_{CC}$ fluctuates, the in-phase component of the data bit lines DB and $\overline{DB}$ is also fluctuated. For example, as illustrated in FIG. 5, due to the increase of the potential of the power supply $V_{CC}$, the potentials of the data bit lines DB and $\overline{DB}$ are both increased. As a result, the conductances of the transistors $Q_{17}$ and $Q_{18}$ are both increased, and in turn, the potential $V_1$ is decreased. Therefore, the conductance of the transistor $Q_{15}$ is decreased so as to increase the reference potential $V_{REF}$. Therefore, as illustrated in FIG. 5, the difference between the potential of the data bit line DB (or $\overline{DB}$) and the reference potential $V_{REF}$ is always almost constant, regardless of the fluctuation of the power supply $V_{CC}$, so that a stable and high-speed sensing operation is achieved.

Figure 6:
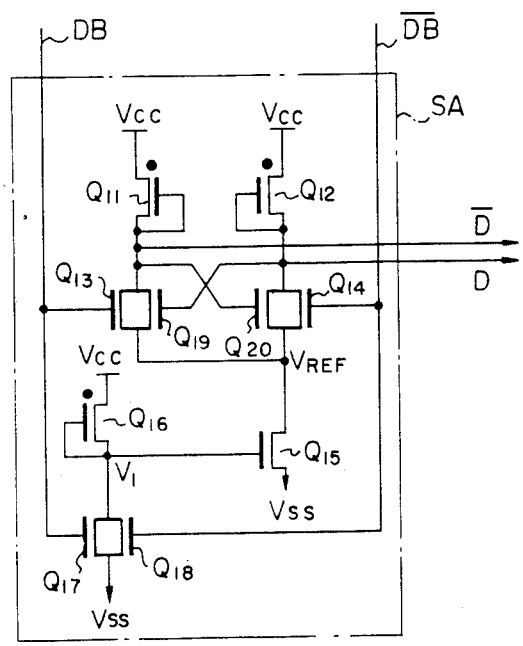
FIGS. 6, 7 and 8 are circuit diagrams illustrating second, third and fourth embodiments of the sense amplifier circuit according to the present invention, respectively.

FIG. 6 is a circuit diagram illustrating a second embodiment of the sense amplifier circuit according to the present invention. In FIG. 6, a latch circuit formed by transistors $Q_{19}$ and $Q_{20}$ is added to the sense amplifier circuit of FIG. 4. Therefore, when a definite difference in potential between the differential signals D and $\overline{D}$ is generated, a latch operation is rapidly effected.

Figure 7:
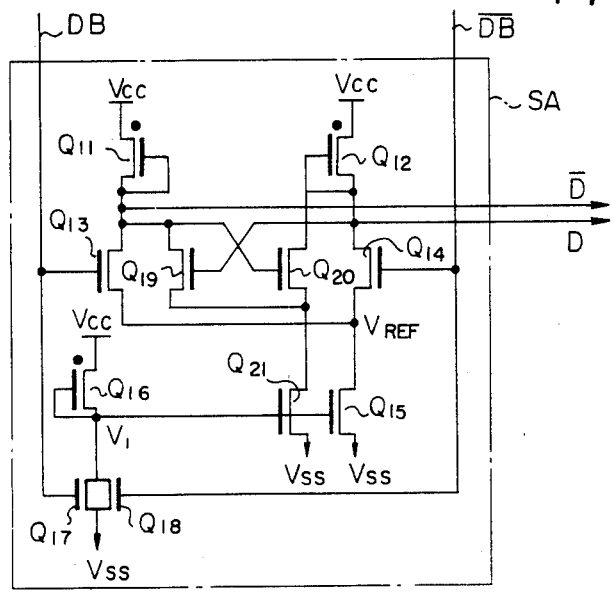

FIG. 7 is a circuit diagram illustrating a third embodiment of the sense amplifier circuit according to the present invention. In FIG. 7, another pull-down circuit formed by a transistor $Q_{21}$ is added to the circuit of FIG. 6. However, the operation of the circuit of FIG. 7 is similar to that of the circuit of FIG. 6.

Figure 8:
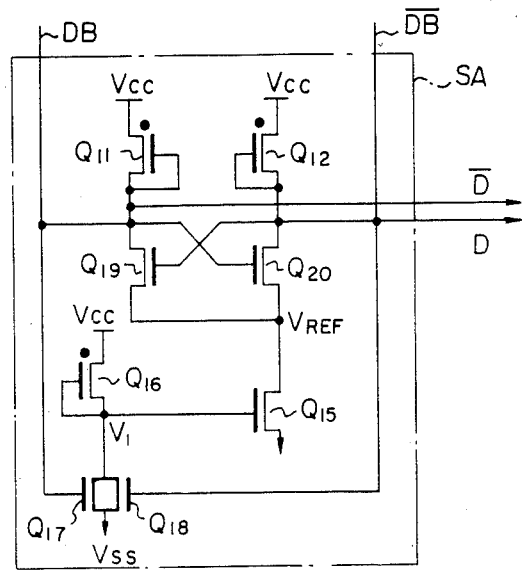

FIG. 8 is a circuit diagram illustrating a fourth embodiment of the sense amplifier circuit according to the present invention. In FIG. 8, the transistors $Q_{13}$ and $Q_{14}$ are omitted from the circuit of FIG. 6, and in addition the data bit lines DB and $\overline{DB}$ are connected to the output lines for generating the differential output signals D and $\overline{D}$. In FIG. 8, immediately after the latch operation is effected, the transistors $Q_{B0}$ and $Q_{B0}'$ (or $Q_{B1}$ and $Q_{B1}'$) are cut off. As a result, the data stored in the latch circuit formed by the transistors $Q_{19}$ and $Q_{20}$ is not fedback to any memory cells.

In FIGS. 4, 6, 7 and 8, each of the load transistors $Q_{11}$, $Q_{12}$ and $Q_{16}$ is of a depletion type; however, this transistor can be of an enhancement type with a drain and a gate coupled.

As explained hereinbefore, the sense amplifier circuit according to the present invention has an advantage, as compared with the conventional circuit, in that a stable sensing operation is performed even when the potential of a power supply fluctuates, since the reference potential $V_{REF}$ is changed in response to the in-phase component of the input lines (the data bit lines DB and $\overline{DB}$).

I claim:

1. A sense amplifier circuit comprising:
   power supplying means, including first and second means for providing first and second potentials, respectively;
   first and second input lines;
   first and second output lines;
   differential amplifier means, operatively connected to said first means of said power supplying means, to said first and second input lines, and to said first and second output lines, for sensing and amplifying the difference in potential between said first and second input lines and for generating bipolar signals, in response to the difference in potential between said first and second input lines, on said output lines;
   first pull-down circuit means, operatively connected to said differential amplifier means, forming a connection node therebetween, and to said second means of said power supplying means, for establishing a reference potential for said differential amplifier means; and compensation circuit means, operatively connected to said first and second means of said power supplying means, to said first pull-down circuit means, and to said input lines, for detecting the out-of-phase component of the potentials on said input lines so as to control the conductance of said first pull-down circuit means, said compensation circuit means comprising:
  a first load transistor operatively connected to said first means of said power supplying means and to said first pull-down circuit means; and
  first and second transistors, each having a drain operatively connected to said first load transistor, a gate operatively connected to one of said input lines and a source operatively connected to said second means of said power supplying means, the sources of said first and second transistors being connected to said second means of said power supplying means independently of the connection node between said differential amplifier means and said first pull-down circuit means.

2. A sense amplifier circuit as set forth in claim 1, wherein said first load transistor is of a depletion type and has its gate and source coupled.

3. A sense amplifier circuit as set forth in claim 1, wherein said first load transistor is of an enhancement type and has its drain and gate coupled.

4. A sense amplifier circuit as set forth in claim 1 wherein said differential amplifier means comprises:
  second and third load transistors connected to said first means of said power supplying means; and
  first and second input transistors of an enhancement type, each having a drain connected to one of said second and third load transistors and to one of said output lines, each having a gate connected to one of said input lines, and each having a source commonly connected to said first pull-down circuit means.

5. A sense amplifier circuit as set forth in claim 4, wherein said second and third load transistors are of a depletion type, each having its gate and source coupled.

6. A sense amplifier circuit as set forth in claim 4, wherein said second and third load transistors are of an enhancement type, each having its drain and gate coupled.

7. A sense amplifier circuit as set forth in claim 4, wherein said differential amplifier means further comprises first and second latch transistors of an enhancement type with drains and gates cross-coupled, each of said first and second latch transistors being connected in parallel to one of said first and second input transistors.

8. A sense amplifier circuit as set forth in claim 1, wherein said first pull-down circuit means comprises a third transistor of an enhancement type having a drain connected to said differential amplifier means, a gate connected to said compensation circuit means, and a source connected to said second means of said power supplying means.

9. A sense amplifier circuit as set forth in claim 1, wherein said first and second transistors are of an enhancement type.

10. A sense amplifier circuit comprising:
  power supplying means, including first and second means for providing first and second potentials, respectively;
  first and second input lines;
  first and second output lines;
  differential amplifier means, connected to said first means of said power supplying means, to said first and second input lines, and to said first and second output lines, for sensing and amplifying the difference in potential between said first and second input lines and for generating bipolar signals, in response to the difference in potential between said first and second input lines, on said output lines, said differential amplifier means comprising:
    first and second load transistors operatively connected to said first means of said power supplying means;
    first and second input transistors of an enhancement type, each having a drain connected to one of said first and second load transistors and to one of said output lines, each having a gate connected to one of said input lines, and each having a source, the sources being commonly connected; and
    first and second latch transistors of an enhancement type, each having a drain and a gate cross-coupled to each other and connected to said second and first load transistors, respectively, and each having a source;
  first pull-down circuit means, operatively connected to said commonly connected sources of said first and second input transistors and to said second means of said power supplying means, for establishing a reference potential for said differential amplifier means;
  compensation circuit means, operatively connected to said first and second means of said power supplying means, to said first pull-down circuit means, and to said input lines, for detecting the out-of-phase component of the potentials on said input lines so as to control the conductance of said first pull-down circuit means; and
  a second pull-down circuit having a conductance, operatively connected to said compensation circuit means and commonly connected to said sources of said first and second latch transistors, the conductance being controlled by said compensation circuit means.

11. A sense amplifier circuit as set forth in claim 10, wherein said second pull-down circuit comprises a third transistor of an enhancement type having a drain connected to said first and second latch transistors, a gate connected to said compensation circuit means, and a source connected to said second potential of said power supplying means.

12. A sense amplifier circuit comprising:
  power supplying means, including first and second means for providing first and second potentials, respectively;
  first and second input lines;
  first and second output lines;
  differential amplifier means, operatively connected to said first means of said power supplying means, to said first and second input lines, and to said first and second output lines, for sensing and amplifying the difference in potential between said first and second input lines and for generating bipolar signals in response to the difference in potential between said first and second input lines, on said output lines, said differential amplifier means comprising:

first and second load transistors operatively connected to said first means of said power supplying means;
and
first and second latch transistors of an enhancement type, each having a drain and a gate cross-coupled to each other, each drain being operatively connected to one of said input lines and to one of said output lines, and each having a source;
first pull-down circuit means, commonly connected to said sources of said first and second latch transistors and to said second means of said power supplying means, for establishing a reference potential for said differential amplifier means; and
compensation circuit means, operatively connected to said first and second means of said power supplying means, to said first pull-down circuit means, and to said input lines, for detecting the out-of-phase component of the potentials on said input lines so as to control the conductance of said pull-down circuit means.

13. A sense amplifier for use with a static random access memory having memory cells, having a plurality of input lines connected to the memory cells, having a plurality of output lines, having means for providing power having at least two means for providing at least two potentials, and having load transistors for the purpose of providing a stable operation even when the potential of at least one of the means for providing power fluctuates, comprising:
means for sensing a difference in potential between two of the input lines connected to one of the memory cells, and for generating bipolar output signals on two corresponding output lines in response to a difference in potential on the two input lines, said means for sensing comprising:
a differential amplifier having at least two transistors, each of said two transistors having a drain connected to respective load transistors, said load transistors operatively connected to one of the at least two means for providing at least two potentials, each of said two transistors having a gate operatively connected to one of the two input lines and each having a source;
further means, operatively connected to said sources of said two transistors in said differential amplifier, said further means comprising:
a pull-down circuit, operatively connected to said differential amplifier and to a second one of the at least two means for providing at least two potentials, for providing the reference voltage to said differential amplifier;
additional means, operatively connected to said further means, for varying the reference voltage provided by said further means in response to a change of the in-phase component of the potentials on the at least two input lines, said additional means comprising:
compensation circuit means, operatively connected to the means for providing power independently of said differential amplifier and said pull-down circuit, to said further means, and to the at least two input lines, for controlling the conduction of said further means.

* * * * *